(12) United States Patent
You et al.

(10) Patent No.: US 11,769,690 B2
(45) Date of Patent: Sep. 26, 2023

(54) SEMICONDUCTOR DEVICE AND METHOD OF FABRICATING THE SAME

(71) Applicant: TAIWAN SEMICONDUCTOR MANUFACTURING CO., LTD., Hsinchu (TW)

(72) Inventors: Jia-Chuan You, Taoyuan (TW); Chia-Hao Chang, Hsinchu (TW); Wai-Yi Lien, Hsinchu (TW); Yu-Ming Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 94 days.

(21) Appl. No.: 17/464,012

(22) Filed: Sep. 1, 2021

(65) Prior Publication Data

US 2021/0398845 A1 Dec. 23, 2021

Related U.S. Application Data

(60) Continuation of application No. 16/730,367, filed on Dec. 30, 2019, now Pat. No. 11,355,387, which is a
(Continued)

(51) Int. Cl.
*H01L 29/78* (2006.01)
*H01L 21/768* (2006.01)
(Continued)

(52) U.S. Cl.
CPC .. *H01L 21/76802* (2013.01); *H01L 21/28247* (2013.01); *H01L 21/76829* (2013.01);
(Continued)

(58) Field of Classification Search
CPC ......... H01L 21/76897; H01L 29/66545; H01L 21/76802; H01L 21/28247;
(Continued)

(56) References Cited

U.S. PATENT DOCUMENTS 5,705,427 A * 1/1998 Chan ....................... H01L 21/28
438/653
6,071,751 A * 6/2000 Wallace .............. H01L 21/3003
257/608
(Continued)

OTHER PUBLICATIONS

U.S. Office Action, dated Aug. 6, 2018, for U.S. Appl. No. 15/609,197.
(Continued)

*Primary Examiner* — Jarrett J Stark
(74) *Attorney, Agent, or Firm* — Birch, Stewart, Kolasch & Birch, LLP

(57) ABSTRACT

A device includes a substrate, a first metal feature over the substrate, first and second spacers, a first dielectric layer, and a second metal feature. The first and second spacers are on opposite sidewalls of the conductive feature, respectively. The first dielectric layer is in contact with the first spacer, in which a top surface of the protection layer is higher than a top surface of the first spacer. The second metal feature is electrically connected to the first metal structure and in contact with a top surface and a sidewall of the protection layer.

20 Claims, 15 Drawing Sheets

Related U.S. Application Data division of application No. 15/609,197, filed on May 31, 2017, now Pat. No. 10,522,392.

(51) Int. Cl.

| | | |
|---|---|---|
| *H01L 21/8234* | (2006.01) | |
| *H01L 21/28* | (2006.01) | |
| *H01L 23/485* | (2006.01) | |
| *H01L 29/417* | (2006.01) | |

(52) U.S. Cl.
CPC .. *H01L 21/76832* (2013.01); *H01L 21/76834* (2013.01); *H01L 21/76897* (2013.01); *H01L 21/823431* (2013.01); *H01L 21/823475* (2013.01); *H01L 23/485* (2013.01); *H01L 29/41791* (2013.01); *H01L 29/785* (2013.01); *H01L 21/823425* (2013.01); *H01L 2029/7858* (2013.01)

(58) Field of Classification Search
CPC ......... H01L 21/76829; H01L 21/76832; H01L 21/76834; H01L 21/823431; H01L 21/823475; H01L 23/485; H01L 29/41791; H01L 29/785; H01L 21/823425; H01L 2029/7858
See application file for complete search history.

(56) References Cited

U.S. PATENT DOCUMENTS

| | | | | |
|---|---|---|---|---|
| 6,080,620 | A * | 6/2000 | Jeng | H01L 27/10852 438/47 |
| 6,100,138 | A * | 8/2000 | Tu | H01L 27/10852 438/254 |
| 6,146,997 | A * | 11/2000 | Liu | H01L 21/76897 438/626 |
| 6,287,957 | B1 | 9/2001 | Linliu | |
| 6,472,261 | B2 * | 10/2002 | Nguyen | H01L 21/76897 257/E21.507 |
| 8,722,523 | B2 * | 5/2014 | Schloesser | H01L 21/823425 257/E21.426 |
| 8,772,109 | B2 | 7/2014 | Colinge | |
| 8,785,285 | B2 | 7/2014 | Tsai et al. | |
| 8,816,444 | B2 | 8/2014 | Wann et al. | |
| 8,823,065 | B2 | 9/2014 | Wang et al. | |
| 8,860,148 | B2 | 10/2014 | Hu et al. | |
| 8,921,947 | B1 | 12/2014 | Hung | H01L 21/28518 257/390 |
| 9,105,490 | B2 | 8/2015 | Wang et al. | |
| 9,147,748 | B1 * | 9/2015 | Xie | H01L 29/517 |
| 9,236,267 | B2 | 1/2016 | De et al. | |
| 9,236,300 | B2 | 1/2016 | Liaw | |
| 9,455,227 | B1 * | 9/2016 | Hung | H01L 21/76843 |
| 9,520,482 | B1 | 12/2016 | Chang et al. | |
| 9,536,980 | B1 * | 1/2017 | Huang | H01L 29/6653 |
| 9,548,366 | B1 * | 1/2017 | Ho | H01L 29/6656 |
| 9,576,814 | B2 | 2/2017 | Wu et al. | |
| 9,608,062 | B1 | 3/2017 | Tseng et al. | |
| 9,608,065 | B1 | 3/2017 | Bergendahl et al. | |
| 10,002,933 | B1 * | 6/2018 | Tang | H01L 29/42376 |
| 10,026,824 | B1 * | 7/2018 | Chanemougame | H01L 21/30604 |
| 10,038,065 | B2 | 7/2018 | Xie et al. | |
| 10,062,784 | B1 * | 8/2018 | Lee | H01L 29/665 |
| 10,269,636 | B2 * | 4/2019 | You | H01L 21/76805 |
| 10,347,739 | B2 * | 7/2019 | Leobandung | H01L 21/28518 |
| 2004/0217407 | A1 * | 11/2004 | Cho | H01L 27/10855 257/311 |
| 2005/0064727 | A1 * | 3/2005 | Lee | H01L 21/823475 257/E21.507 |
| 2005/0136683 | A1 * | 6/2005 | Lee | H01L 21/76897 257/E21.507 |
| 2009/0163010 | A1 * | 6/2009 | Oh | H01L 21/823456 438/587 |
| 2010/0133641 | A1 * | 6/2010 | Kim | H01L 27/14689 257/E31.11 |
| 2011/0156107 | A1 * | 6/2011 | Bohr | H01L 29/785 257/E21.409 |
| 2011/0183512 | A1 * | 7/2011 | Cho | H01L 27/10855 257/E21.585 |
| 2011/0298061 | A1 * | 12/2011 | Siddiqui | H01L 29/66545 257/E21.409 |
| 2012/0043592 | A1 * | 2/2012 | Zhao | H01L 23/53266 438/653 |
| 2012/0052667 | A1 * | 3/2012 | Kim | H01L 21/76897 438/586 |
| 2013/0075821 | A1 * | 3/2013 | Baars | H01L 21/76814 257/E27.06 |
| 2013/0075826 | A1 * | 3/2013 | Xu | H01L 29/66583 257/E21.632 |
| 2013/0137257 | A1 * | 5/2013 | Wei | H01L 21/28079 438/586 |
| 2013/0193489 | A1 * | 8/2013 | Baars | H01L 21/76816 257/E21.59 |
| 2013/0277767 | A1 * | 10/2013 | Li | H01L 21/76834 257/411 |
| 2013/0292847 | A1 * | 11/2013 | Choi | H01L 21/76816 257/774 |
| 2014/0035010 | A1 * | 2/2014 | Cai | H01L 29/66545 257/288 |
| 2014/0077305 | A1 * | 3/2014 | Pethe | H01L 23/53257 257/E21.409 |
| 2014/0199837 | A1 | 7/2014 | Hung et al. | |
| 2014/0273386 | A1 * | 9/2014 | Tsao | H01L 21/76814 438/301 |
| 2014/0346575 | A1 * | 11/2014 | Chen | H01L 21/76816 438/666 |
| 2015/0021683 | A1 * | 1/2015 | Xie | H01L 21/823425 438/270 |
| 2015/0021696 | A1 * | 1/2015 | Sung | H01L 29/66492 257/368 |
| 2015/0035086 | A1 * | 2/2015 | Xie | H01L 29/785 257/411 |
| 2015/0060974 | A1 * | 3/2015 | Sung | H01L 29/7831 257/314 |
| 2015/0108589 | A1 * | 4/2015 | Cheng | H01L 29/66545 257/411 |
| 2015/0206844 | A1 * | 7/2015 | Pham | H01L 21/76831 438/624 |
| 2015/0214289 | A1 * | 7/2015 | Kim | H01L 27/10823 438/387 |
| 2015/0221696 | A1 * | 8/2015 | Lee | H01L 27/14643 257/292 |
| 2015/0364371 | A1 * | 12/2015 | Yen | H01L 21/7685 438/666 |
| 2016/0035857 | A1 * | 2/2016 | Leobandung | H01L 29/66545 257/288 |
| 2016/0056262 | A1 * | 2/2016 | Ho | H01L 21/47635 257/288 |
| 2016/0079173 | A1 * | 3/2016 | Tung | H01L 21/76834 438/653 |
| 2016/0190322 | A1 * | 6/2016 | Liu | H01L 29/0847 438/283 |
| 2016/0211251 | A1 * | 7/2016 | Liaw | H01L 27/0207 |
| 2016/0284817 | A1 * | 9/2016 | Basker | H01L 29/6656 |
| 2016/0293725 | A1 * | 10/2016 | Liou | H01L 21/76834 |
| 2016/0336270 | A1 * | 11/2016 | Chen | H01L 21/76865 |
| 2016/0372332 | A1 * | 12/2016 | Pranatharthiharan | H01L 21/823864 |
| 2016/0379925 | A1 * | 12/2016 | Ok | H01L 21/76897 438/666 |
| 2017/0004997 | A1 * | 1/2017 | Lu | H01L 21/31133 |
| 2017/0047253 | A1 | 2/2017 | Park et al. | |
| 2017/0084721 | A1 * | 3/2017 | Hung | H01L 21/76897 |
| 2017/0110549 | A1 * | 4/2017 | Xie | H01L 29/0649 |
| 2017/0117379 | A1 * | 4/2017 | Chen | H01L 29/45 |
| 2017/0170067 | A1 * | 6/2017 | Yeh | H01L 29/66545 |
| 2017/0186849 | A1 * | 6/2017 | Chen | H01L 21/76883 |
| 2017/0194211 | A1 * | 7/2017 | Lai | H01L 21/823475 |
| 2017/0256444 | A1 * | 9/2017 | Chang | H01L 29/66545 |

(56) References Cited

U.S. PATENT DOCUMENTS

| | | | |
|---|---|---|---|
| 2017/0345759 A1* | 11/2017 | Lin | H01L 29/66795 |
| 2018/0033693 A1* | 2/2018 | Hung | H01L 29/0653 |
| 2018/0033866 A1* | 2/2018 | Liao | H01L 29/42376 |
| 2018/0068951 A1* | 3/2018 | Hung | H01L 21/823871 |
| 2018/0138176 A1* | 5/2018 | Shen | H01L 29/0847 |
| 2018/0174904 A1* | 6/2018 | Hsieh | H01L 21/76831 |
| 2018/0211874 A1* | 7/2018 | Basker | H01L 29/66795 |
| 2018/0277652 A1* | 9/2018 | Park | H01L 21/76897 |
| 2018/0315652 A1* | 11/2018 | Tsai | H01L 29/665 |
| 2018/0337060 A1* | 11/2018 | Chang | H01L 21/31111 |
| 2018/0342420 A1* | 11/2018 | You | H01L 21/76843 |
| 2019/0131430 A1* | 5/2019 | Xie | H01L 29/6656 |
| 2020/0006515 A1* | 1/2020 | Chen | H01L 21/823864 |
| 2020/0373409 A1* | 11/2020 | Chen | H01L 21/02499 |

OTHER PUBLICATIONS

U.S. Office Action, dated Jan. 30, 2018, for U.S. Appl. No. 15/609,197.
U.S. Office Action, dated May 23, 2019, for U.S. Appl. No. 15/609,197.
U.S. Office Action, dated Oct. 30, 2017, for U.S. Appl. No. 15/609,197.

\* cited by examiner

SEMICONDUCTOR DEVICE AND METHOD OF FABRICATING THE SAME

PRIORITY CLAIM AND CROSS-REFERENCE

The present application is a Continuation application of U.S. application Ser. No. 16/730,367, filed on Dec. 30, 2019, which is a Divisional application of U.S. application Ser. No. 15/609,197, filed on May 31, 2017, now U.S. Pat. No. 10,522,392, issued on Dec. 31, 2019, which are herein incorporated by reference in their entireties.

BACKGROUND

As the technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high-dielectric-constant (high-k) gate dielectric layers are also used which allow greater physical thicknesses while maintaining the same effective thickness as would be provided by a thinner layer of the gate oxide used in larger technology nodes.

However, there are challenges to implementing such features and processes in complementary metal-oxide-semiconductor (CMOS) fabrication. As the gate length and spacing between devices decrease, these problems are exacerbated. For example, source/drain regions may short to metal gate structures due to misalignment of contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
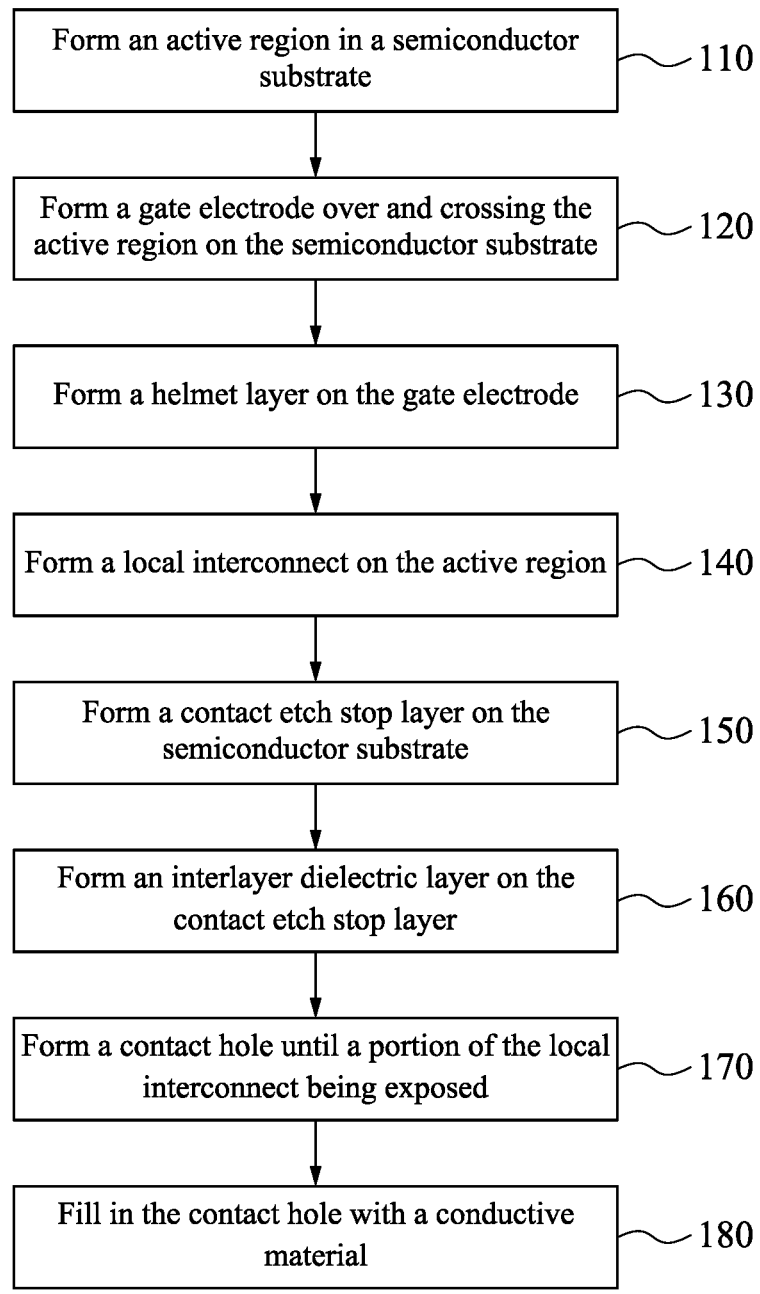
FIG. 1 is a flow chart illustrating a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Referring to FIG. 1, a flow chart of a method 100 of fabricating a semiconductor device in accordance with some embodiments of the instant disclosure. The method begins with operation 110 in which an active region is formed in a semiconductor substrate. The method continues with operation 120 in which a gate electrode is formed over and crossing the active region on the semiconductor substrate. Subsequently, operation 130 is performed. A helmet layer is formed on the gate electrode. The method continues with operation 140 in which a bottom conductive feature is formed on the active region. The method continues with operation 150 in which a contact etch stop layer is formed on the semiconductor substrate. The method continues with operation 160 in which an interlayer dielectric layer is formed on the contact etch strop layer. The method continues with operation 170 in which a via hole is formed until a portion of the bottom conductive feature is exposed. A portion of the via hole lands on the helmet layer. Subsequently, in operation 180 the via hole is filled with a conductive material. The discussion that follows illustrates embodiments of semiconductor devices that can be fabricated according to the method 100 of FIG. 1.

Figure 2:
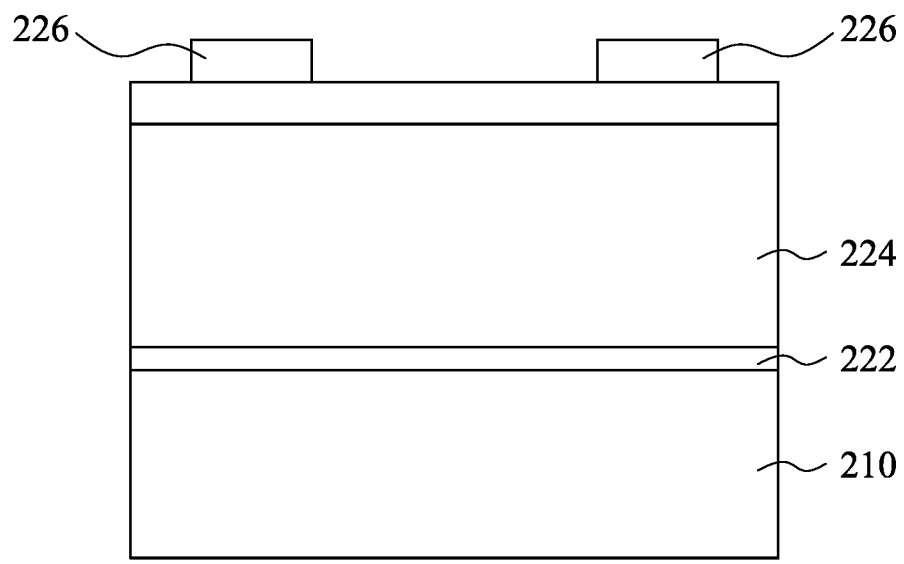
FIGS. 2-24 are cross-sectional views of a portion of a semiconductor device at various stages in a helmet layer formation process in accordance with some embodiments of the instant disclosure.

Reference is made to FIG. 2. A cross-sectional view of an example FinFET device 200 is illustrated. The FinFET device 200 is a non-planar multi-gate transistor that is built on a semiconductor substrate (not shown). The semiconductor substrate is patterned to form a fin structure 210. The fin structure 210 extends in an elongate manner. The fin structure 210 forms the body of the FinFET device 200. A high-k dielectric layer 222 is formed around the fin structure 210, and a dummy gate layer 224 is formed on the high-k dielectric layer 222. The high-k dielectric layer 222 includes a material having a dielectric constant, k, of at least or equal to about 4.0. Examples of high-k dielectric material include hafnium-based materials such as $HfO_2$, HfSiO, HfSiON, HfTaO, HfTiO, HfZrO, and $HfO_2Al_2O_3$ alloy. Additional examples of high-k dielectrics include $ZrO_2$, $Ta_2O_5$, $Al_2O_3$, $Y_2O_3$, $La_2O_3$, and $SrTiO_3$. The high-k dielectric layer 222 and the dummy gate layer 224 may each be formed using a deposition process, for example chemical vapor deposition (CVD), physical vapor deposition (PVD), atomic layer deposition (ALD), combinations thereof, or another suitable process. The FinFET device 200 includes masks 226a and 226b for the patterning of the dummy gate structures 220a and 220b.

Figure 3:
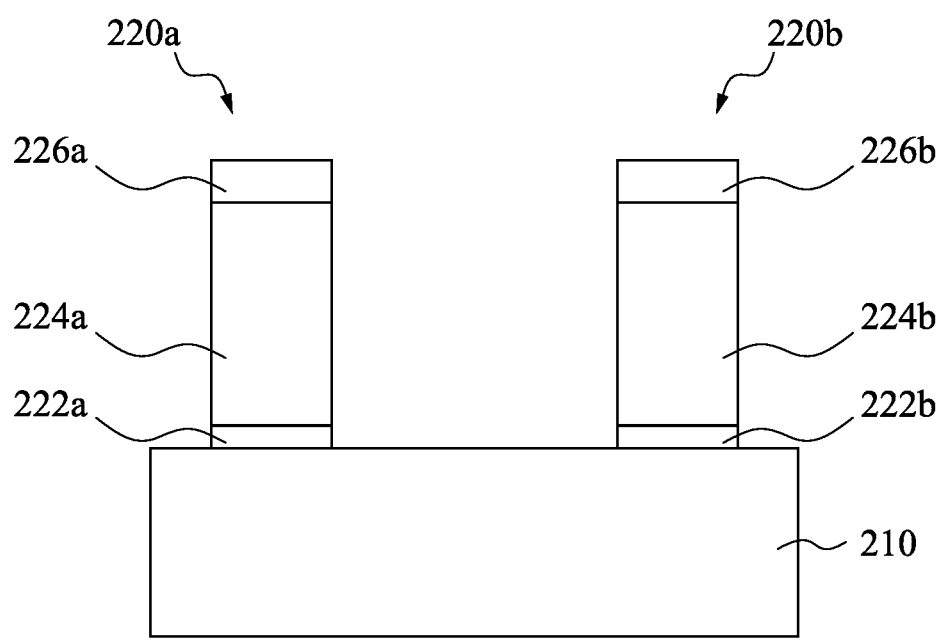

Reference is made to FIG. 3. For forming the dummy gate structures 220a and 220b, a patterning process is performed. The patterning can be accomplished by a photolithographic process. The high-k dielectric layer 222 and dummy gate layer 224 are etched according to the pattern of masks 226a and 226b. Any etch process or combination of etch processes can be used in the patterning process. After the patterning, a first dummy gate structure 220a and a second dummy gate structure 220b are formed. The first and second dummy gate structures 220a and 220b are elongated bars crossing the fin structure 210 in substantially perpendicular manner. The first and second dummy gate structures 220a and 220b are gate electrodes having longitudinal directions parallel to each other. The first and second dummy gate structures 220a and 220b define the channel region of the fin structure 210. The first dummy gate structure 220a includes the high-k dielectric layer 222a, the dummy gate layer 224a, and mask 226a. The second dummy gate structure 220b includes the high-k dielectric layer 222b, the dummy gate layer 224b, and mask 226b.

Figure 4:
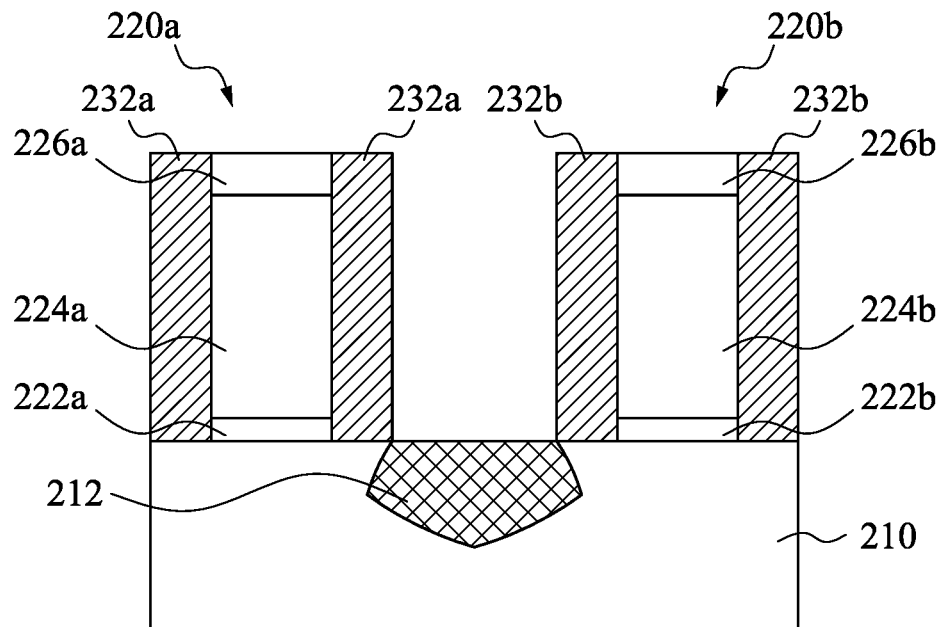

Reference is made to FIG. 4. An ion implantation process may be performed to form lightly doped drain (LDD) regions (not shown). The dummy gate structures 220a and 220b are used as masks to help control the implant profile and distribution. First and second spacers 232a and 232b are formed around the first and second dummy gate structure 220a and 220b respectively. A spacer material is first deposited over the entire semiconductor substrate. The spacer material is then etched back, and selected portions 232a and 232b of the spacer material around the first and second dummy gate structures 220a and 220b remain after the etch back. The first dummy gate structure 220a is sandwiched between the first spacers 232a, and the second dummy gate structure 220b is sandwiched between the second spacers 232b.

Reference is still made to FIG. 4 and operation 110 in FIG. 1. An active region is formed in the semiconductor substrate. An active region includes a channel region, a source region and a drain region of the FinFET device 200. The source region and drain region are formed in extensions of the fin structure 210 on opposite sides of the dummy gate structures 220a and 220b. The effective channel length of the FinFET device 200 is determined by the dimensions of the fin structure 210. As shown in FIG. 4, the source/drain region 212 is formed in the fin structure 210. The formation of source/drain region 212 may be achieved by etching the fin structure 210 to form recesses therein, and then performing an epitaxy to grow the source/drain region 212 in the recesses. For the sake of clarity, only a portion of the active region is shown throughout FIGS. 4-20.

Figure 5:
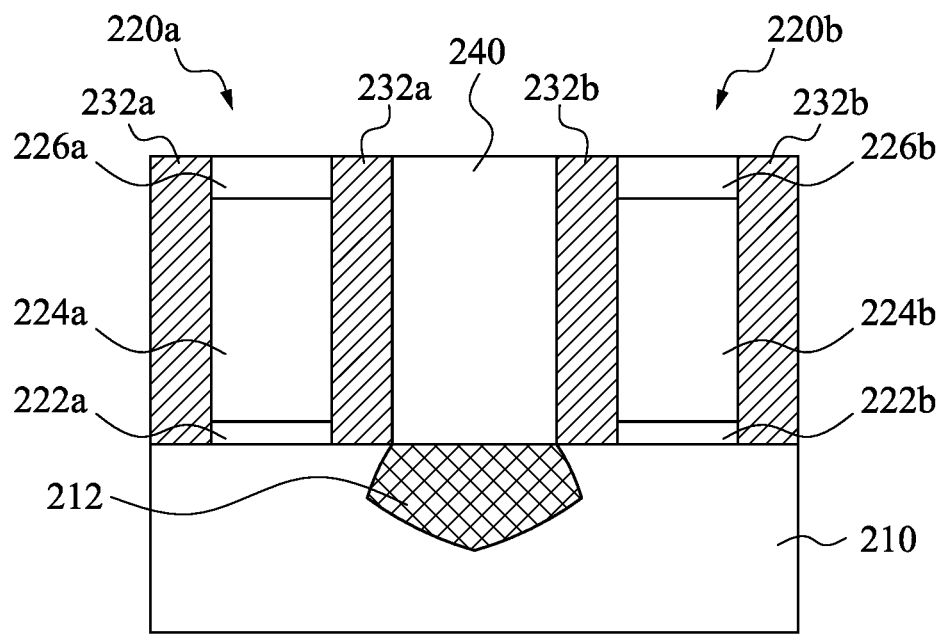

Reference is made to FIG. 5 and operation 120 in FIG. 1. A first interlayer dielectric (ILD) layer 240 is formed. The first ILD layer 240 may comprise a dielectric material. The dielectric material may comprise silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or combinations thereof. It is understood that the first ILD layer 240 may comprise one or more dielectric materials and/or one or more dielectric layers. In some embodiments, the first ILD layer 240 may be deposited to a suitable thickness by CVD, high density plasma (HDP) CVD, sub-atmospheric CVD (SACVD), spin-on, sputtering, or other suitable methods. The first ILD layer 240 adheres well to the first and second spacers 232a and 232b and over the top of the masks 226a and 226b. After the first ILD layer 240 is formed, an upper surface of the semiconductor substrate is planarized to lower the surface to the level of the first and second dummy gate structures 220a and 220b. The planarization is accomplished by, for example, chemical mechanical polishing (CMP). After planarizing, the mask 226a and 226b are removed, and the dummy gate layers 224a and 224b, the first and second spacers 232a and 232b, and the first ILD layer 240 all approximately have the same height.

Figure 6:
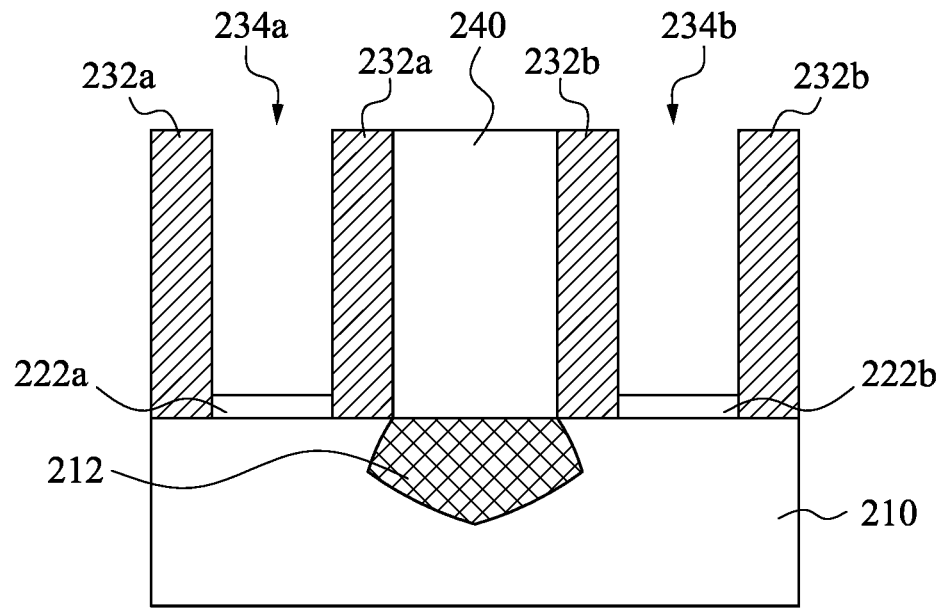

Reference is made to FIG. 6 and operation 120 in FIG. 1. The dummy gate layers 224a and 224b are removed to form recesses 234a and 234b. The dummy gate layers 224a and 224b are removed in one or many etch operations including wet etch and dry etch. According to various embodiments, a hard mask is patterned over the fin structure 210 to protect the first ILD layer 240 and the first and second spacers 232a and 232b. The dummy gate layer etch may stop at the high-k dielectric layers 222a and 222b. In some embodiments, the high-k dielectric layers 222a and 222b may be removed along with the dummy gate layers 224a and 224b. A recess 234a is formed between the first spacers 232a, and a recess 234b is formed between the second spacers 232b.

Figure 7:
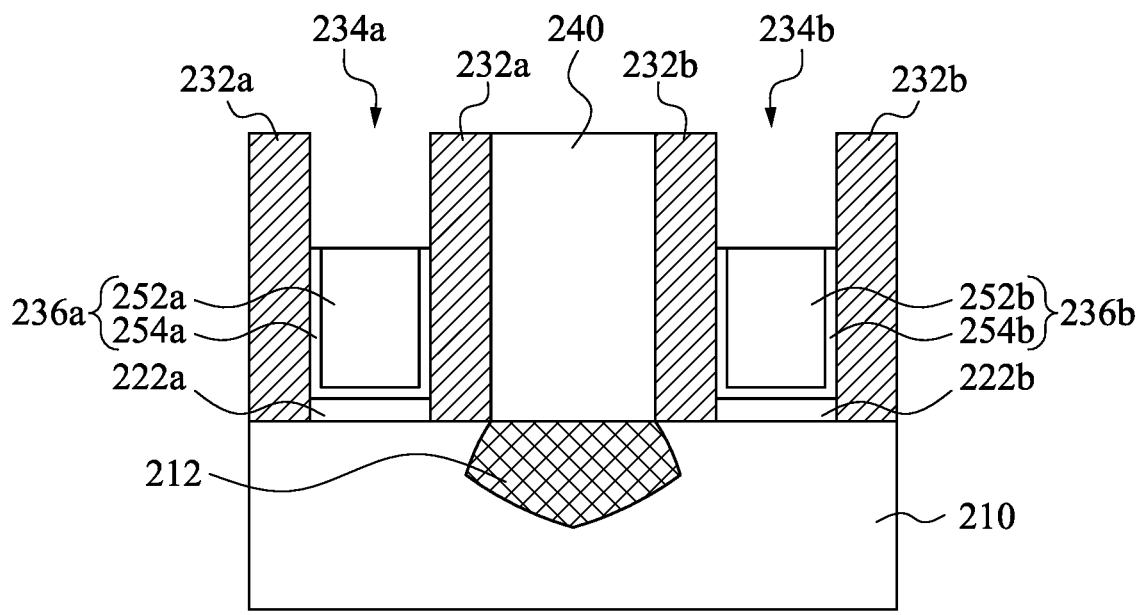

Reference is made to FIG. 7 and operation 120 in FIG. 1. A metal layer may be formed to fill in the recesses 234a and 234b. The metal layer may include any metal material suitable for forming metal gate electrode layers 254a and 254b or portions thereof, including work function layers, liner layers, interface layers, seed layers, adhesion layers, barrier layers, etc. In some embodiments, the metal layer may include suitable metals, such as TiN, WN, TaN, or Ru that properly perform in the PMOSFET. In some alternative embodiments, the metal layer may include suitable metals, such as Ti, Ag, Al, TiAl, TiAlN, TiAlC, TiAlCN, TaC, TaCN, TaSiN, Mn, or Zr that properly perform in the NMOSFET. As shown in FIG. 7, work function metal layers 252a and 252b are formed in the recesses 234a and 234b and cover the high-k dielectric layers 222a and 222b and sidewalls of the recesses 234a and 234b. Subsequently, the metal gate electrode layers 254a and 254b are formed in the recesses 234a and 234b. The work function metal layers 252a and 252b may be formed by conformally deposited a work function material layer on the semiconductor substrate. The overfilled work function metal material layer and the metal gate electrode material layer are pulled back by, for example, etching, to form the first and second gate stacks 236a and 236b in the recesses 234a and 234b respectively. The first and second gate stacks 236a and 236b are high-k metal gates.

Figure 8:
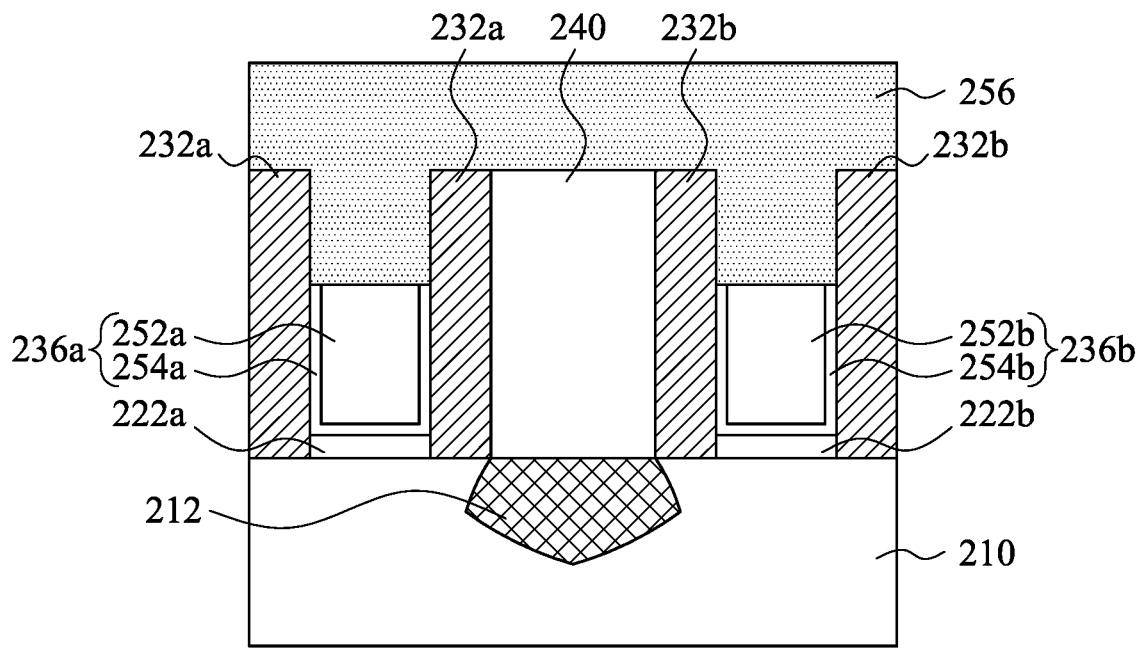

Reference is made to FIG. 8 and operation 120 in FIG. 1. A first hard mask 256 fills in the remaining of the recesses 234a and 234b. A material of the first hard mask includes, for example, SiO, SiN, SiOC, and SiOCN. The first hard mask 256 serves to protect the underlying components like the work function metal layers 252a and 252b and the metal gate electrode layers 254a and 254b in the subsequent via formation process.

Figure 9:
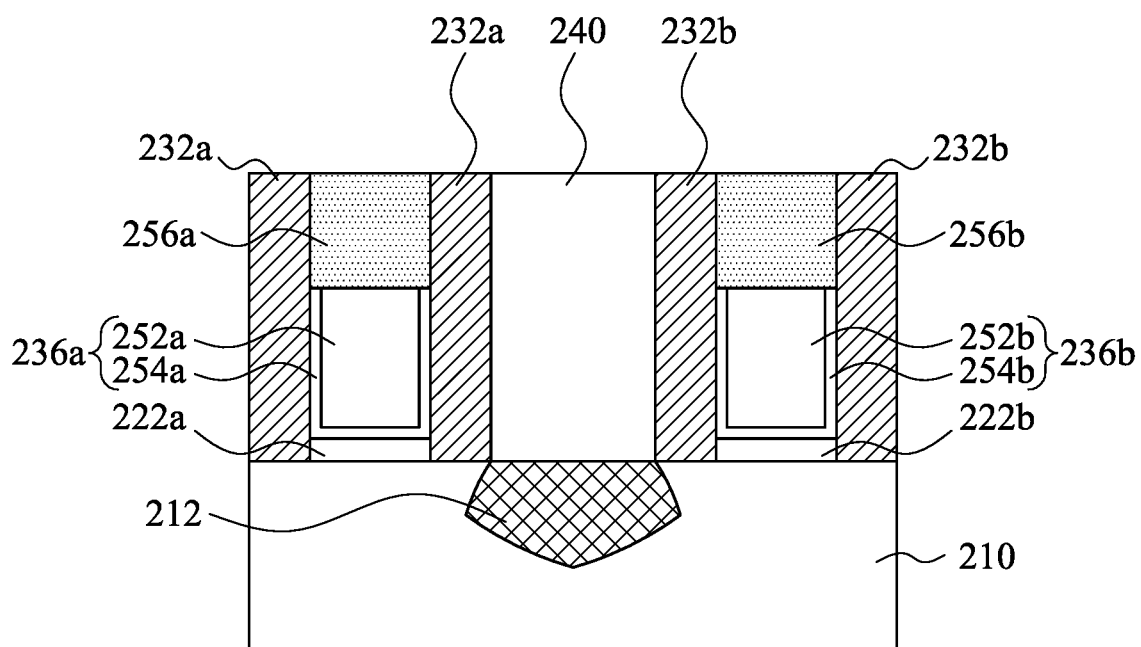

Reference is made to FIG. 9 and operation 120 in FIG. 1. A polishing process, for example, CMP is performed, and the first hard mask 256 is lowered to level with the first and second spacers 232a and 232b. The first gate stack 236a includes the high-k dielectric layer 222a, work function metal layer 252a, metal gate electrode layer 254a and first hard mask 256a. The first gate stack 236a is flanked by the first spacers 232a. The second gate stack 236b includes the high-k dielectric layer 222b, work function metal layer 252b, metal gate electrode layer 254b and first hard mask 256b. The second gate stack 236b is flanked by the second spacers 232b.

Figure 10:
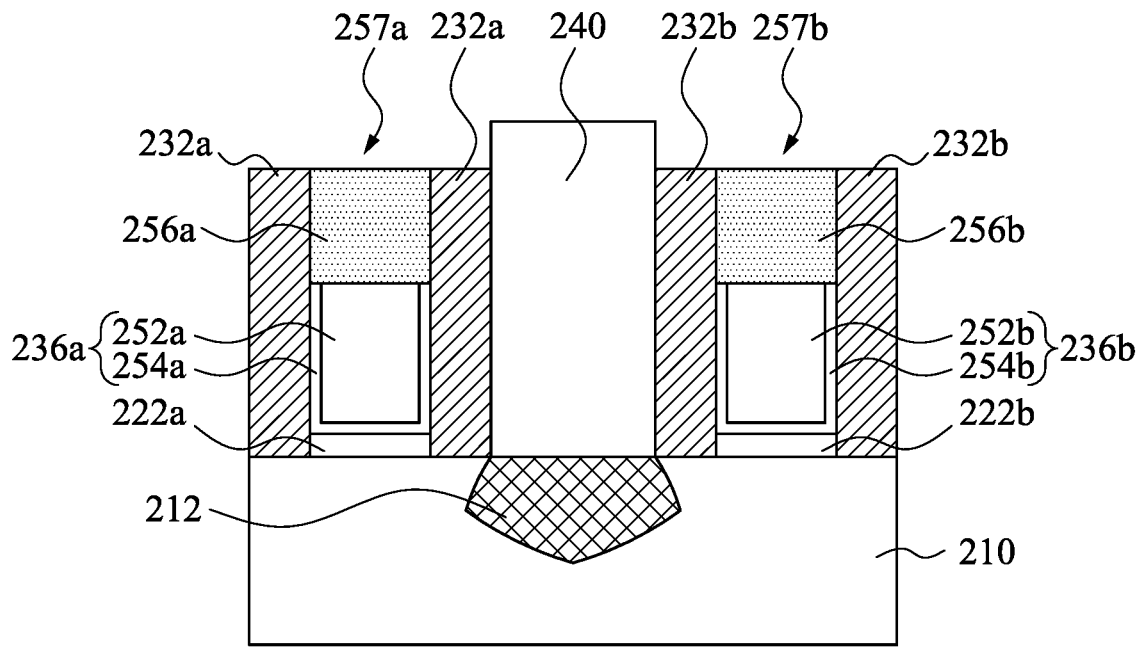

Reference is made to FIG. 10 and operation 130 in FIG. 1. After the first hard masks 256a and 256b are formed, the first and second gate stacks 236a and 236b are etched back. The etching back includes removes portions of the first hard masks 256a and 256b and first and second spacers 232a and 232b. A mask layer (not shown) is formed on the first ILD layer 240 during first and second gate stacks 236a and 236b etching back. The first ILD layer 240 remains its height, while the first and second spacers 232a and 232b and the first hard masks 256a and 256b recede to yield recesses 257a and 257b. The top surfaces of the first and second gate stacks 236a and 236b are lower than the top surfaces of the first ILD layer 240. The recesses 257a and 257b may have a depth of approximately 10 to 30 nm.

Figure 11:
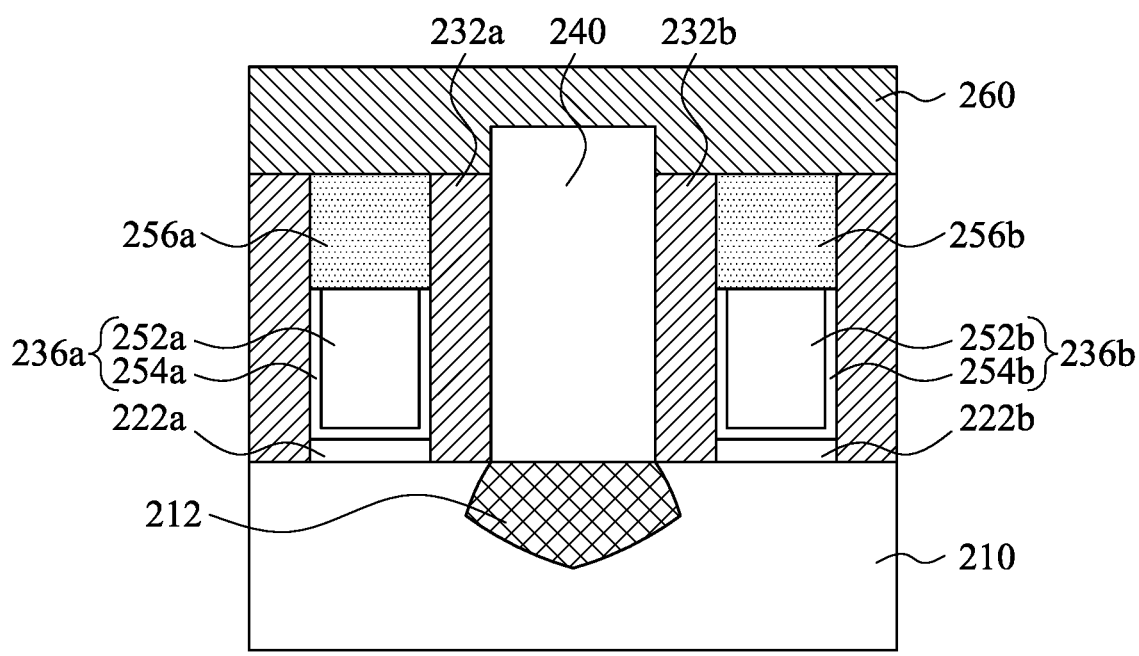

Reference is made to FIG. 11 and operation 130 in FIG. 1. A helmet material layer 260 is deposited on the semiconductor substrate. The helmet material layer 260 may be deposited by, for example, CVD, PVD, ALD or the like. The helmet material layer 260 blankets the surface of the semiconductor substrate, covering the gate stacks and the first ILD layer 240. The helmet material layer 260 includes a material, for example, SiCN, AlO, AlON, ZrO, ZrN, and HfO. The helmet material layer 260 may include one or more layers using a combination of the materials. The helmet material layer 260 serves as a protection layer to its underlying components like the first hard masks 256a and 256b and the first and second spacers 232a and 232b. An etching selectivity between the helmet material layer 260 and the first hard masks 256a and 256b is larger than approximately 10.

Figure 12:
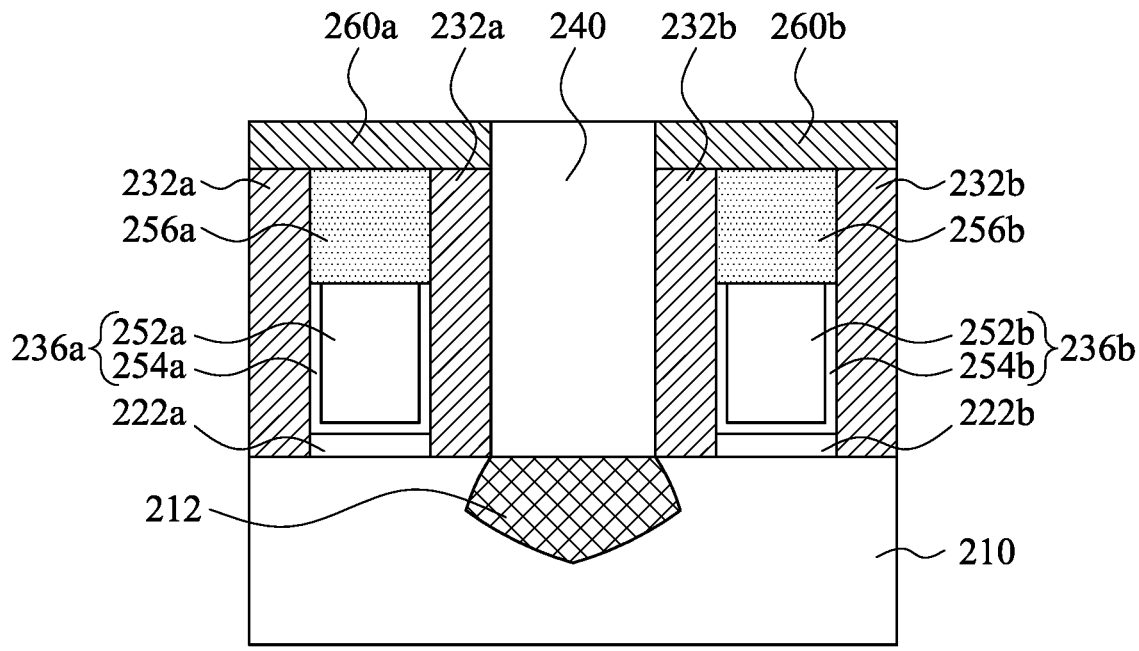

Reference is made to FIG. 12 and operation 130 in FIG. 1. A planarization process is performed to remove excess helmet material layer 260 over the first ILD layer 240. The planarization process may be CMP, and the helmet layers 260a and helmet layer 260b are level with the first ILD layer 240. Helmet layers 260a and 260b are formed respectively on the first gate stack 236a and second gate stack 236b. The helmet layers 260a and 260b have the thickness of approximately 10 to 30 nm, which is the depth of the recesses 257a and 257b. The first ILD layer 240 is not covered by the helmet layers 260a and 260b. The first and second gate stacks 236a and 236b, including the high-k dielectric layers 222a and 222b, metal gate electrode layers 254a and 254b, work function metal layers 252a and 252b, first and second spacers 232a and 232b and first hard masks 256a and 256b, are now under coverage of the helmet layers 260a and 260b, while the first ILD layer 240 is exposed.

Figure 13:
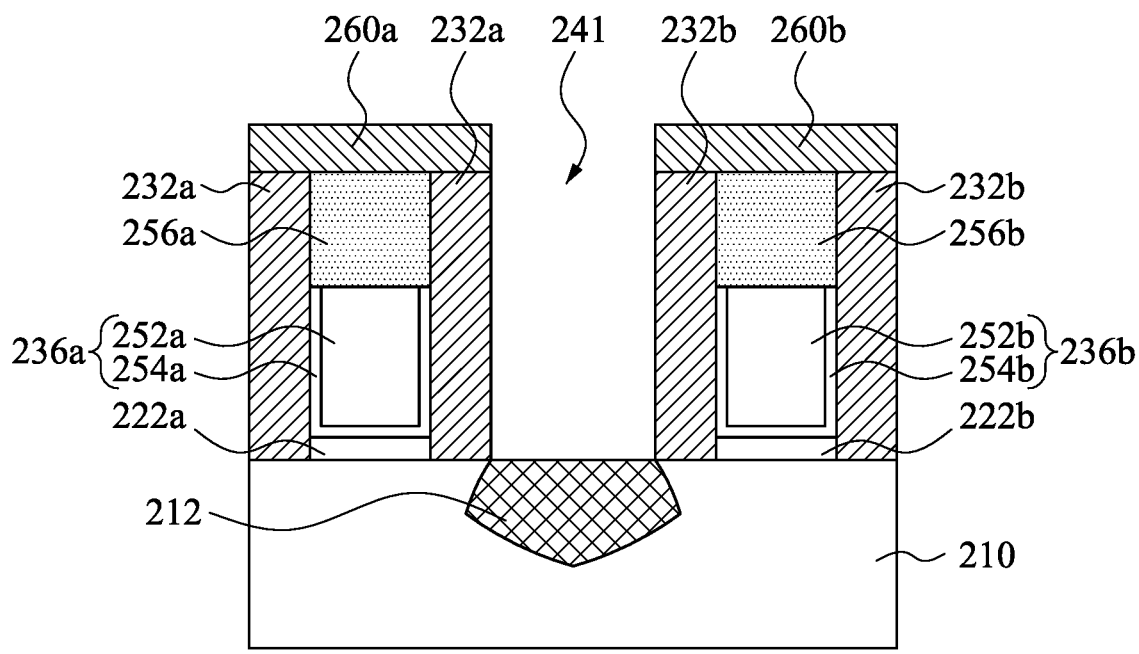

Reference is made to FIG. 13 and operation 140 in FIG. 1. The first ILD layer 240 is removed. The first ILD layer 240 may be removed by etching back. The first and second gate stacks 236a and 236b are protected by the helmet layers 260a and 260b and remain intact during the first ILD layer 240 removal. The removal of the first ILD layer 240 results in the formation of an opening 241 and the exposure of the underlying source/drain region 212 (active region) in the fin structure 210 as shown in FIG. 13.

Figure 14:
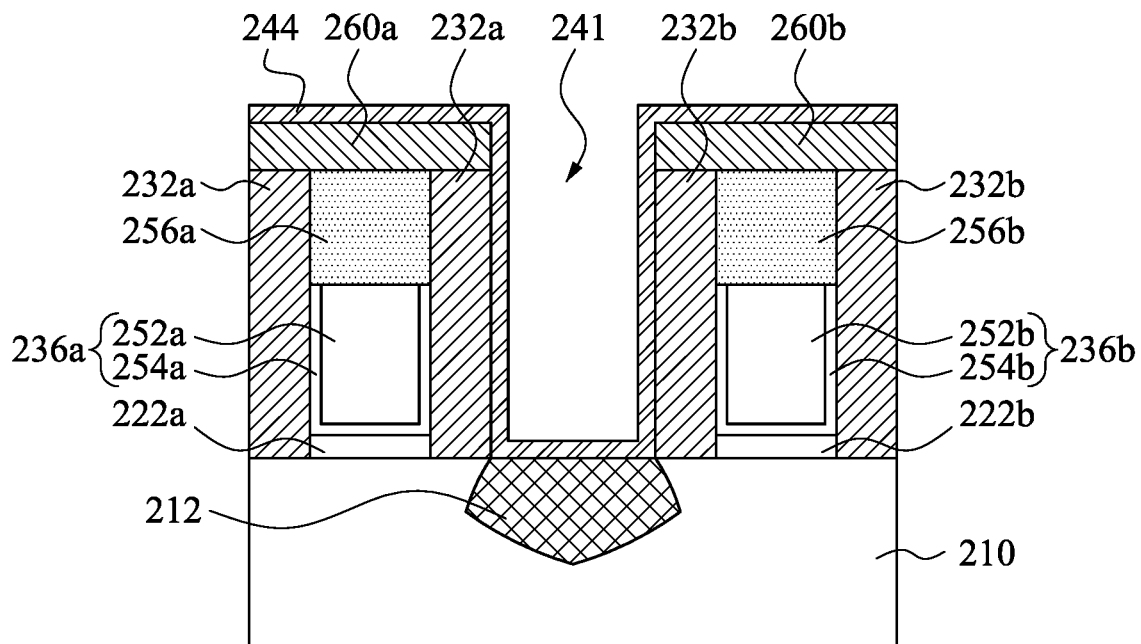

Reference is made to FIG. 14 and operation 140 in FIG. 1. A first barrier layer 244 is deposited on the FinFET device 200. The first barrier layer 244 lines the top surface of the helmet layers 260a and 260b, the sidewalls of the first and second spacers 232a and 232b and the bottom of the opening 241. In some embodiment, the first barrier layer 244 has a thickness of about 10 angstroms to about 300 angstroms. In some embodiments, the first barrier layer 244 is a metal or metal alloy layer. The first barrier layer 244 may include cobalt (Co), silver (Ag), aluminum (Al), zinc (Zn), calcium (Ca), gold (Au), magnesium (Mg), tungsten (W), molybdenum (Mo), nickel (Ni), chromium (Cr), or the like, which may be deposited by using e.g., PVD, CVD, plasma enhanced CVD (PECVD), low pressure CVD (LPCVD), or the like.

Figure 15:
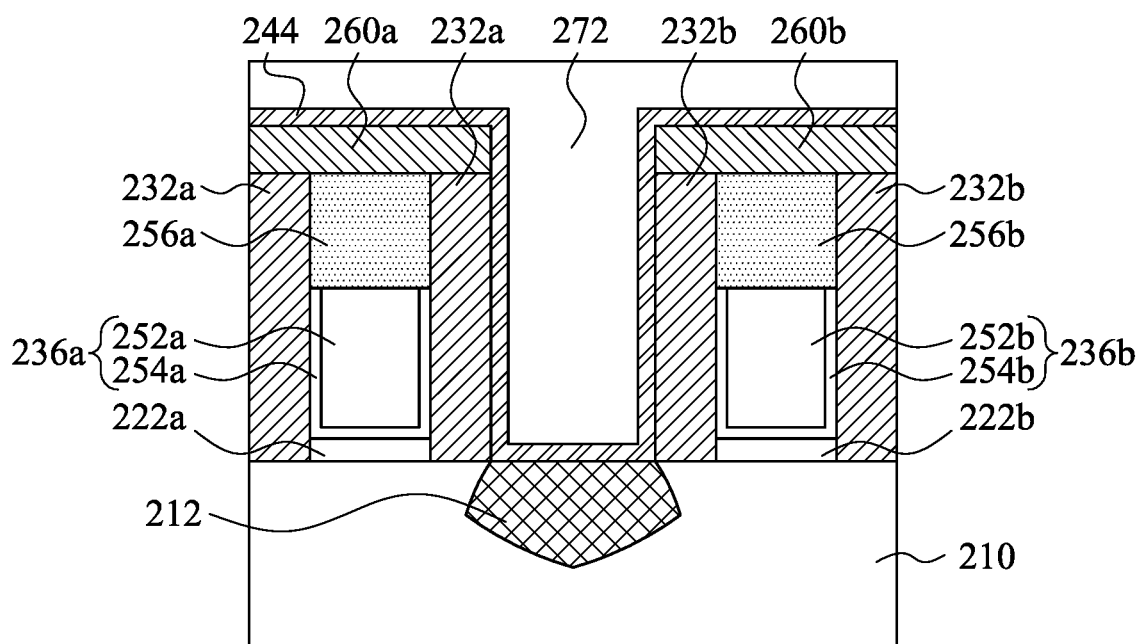

Reference is made to FIG. 15 and operation 140 in FIG. 1. A bottom conductive feature 272 is deposited on the first barrier layer 244. The opening 241 left after the removal of the first ILD layer 240 is replaced by the bottom conductive feature 272. The bottom conductive feature 272 is wrapped around in the pocket lined by the first barrier layer 244. The bottom conductive feature 272 includes electrically conductive materials and provides electrical connection to the source/drain region 212.

Figure 16:
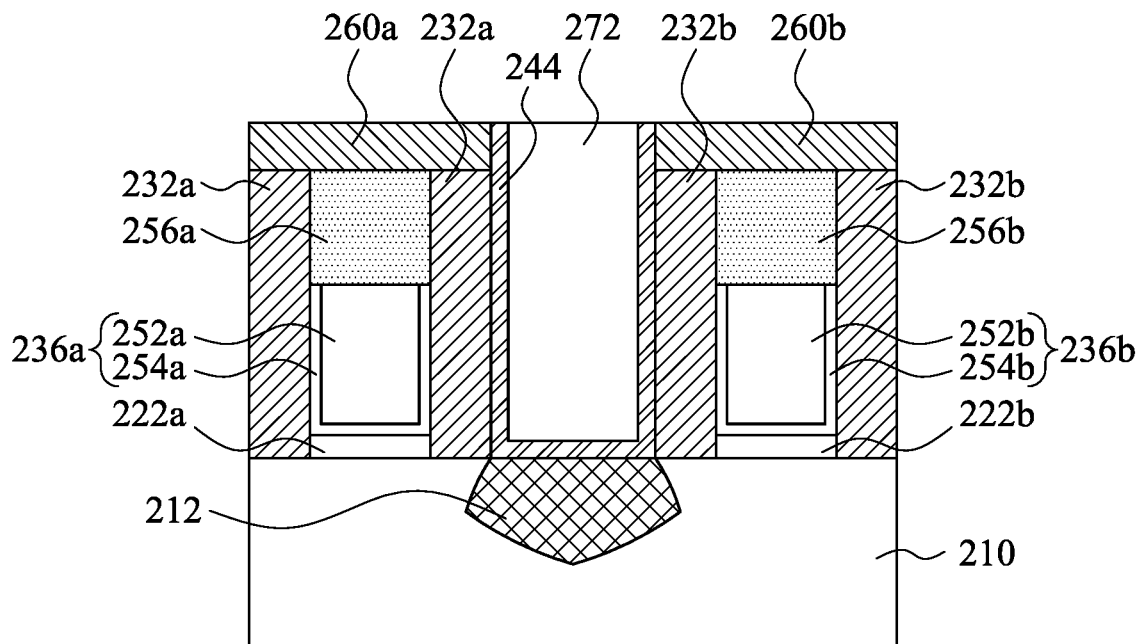

Reference is made to FIG. 16 and operation 140 in FIG. 1. The excess bottom conductive feature 272 and first barrier layer 244 are removed by, for example CMP. After the planarization, top surface of the bottom conductive feature 272 and the first barrier layer 244 are level with the first and second helmet layers 260a and 260b. The bottom conductive feature 272 serves to communicate between lateral components on the active region.

Figure 17:
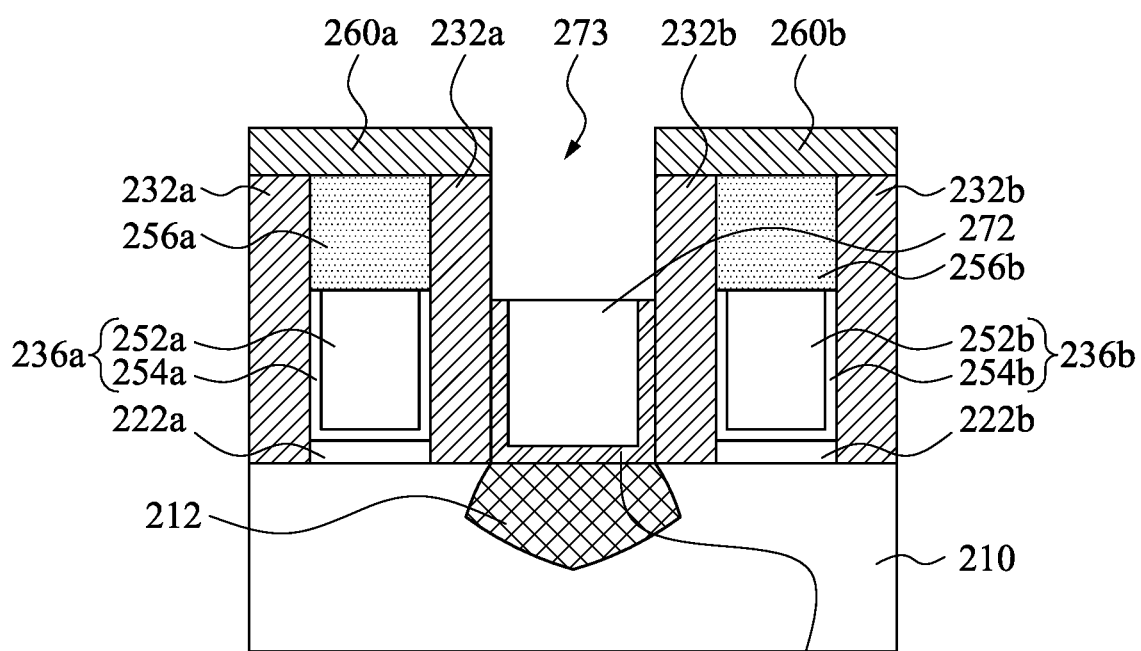

Reference is made to FIG. 17. An etching back is performed to remove a portion of the bottom conductive feature 272 and the first barrier layer 244. The top surface of the bottom conductive feature 272 and the first barrier layer 244 are brought down. The height of the bottom conductive feature 272 and the first barrier layer 244 is lower than the bottoms of the first hard masks 256a and 256b. After etching back, au upper portion of the first and second spacers 232a and 232b are bare and free of the first barrier layer 244 and bottom conductive feature 272. An opening 273 is formed after the removal of the portion of the bottom conductive feature 272. The opening 273 is defined by the top surface of the bottom conductive feature 272 (first barrier layer 244) and the sidewalls of the first and second spacers 232a and 232b.

Figure 18:
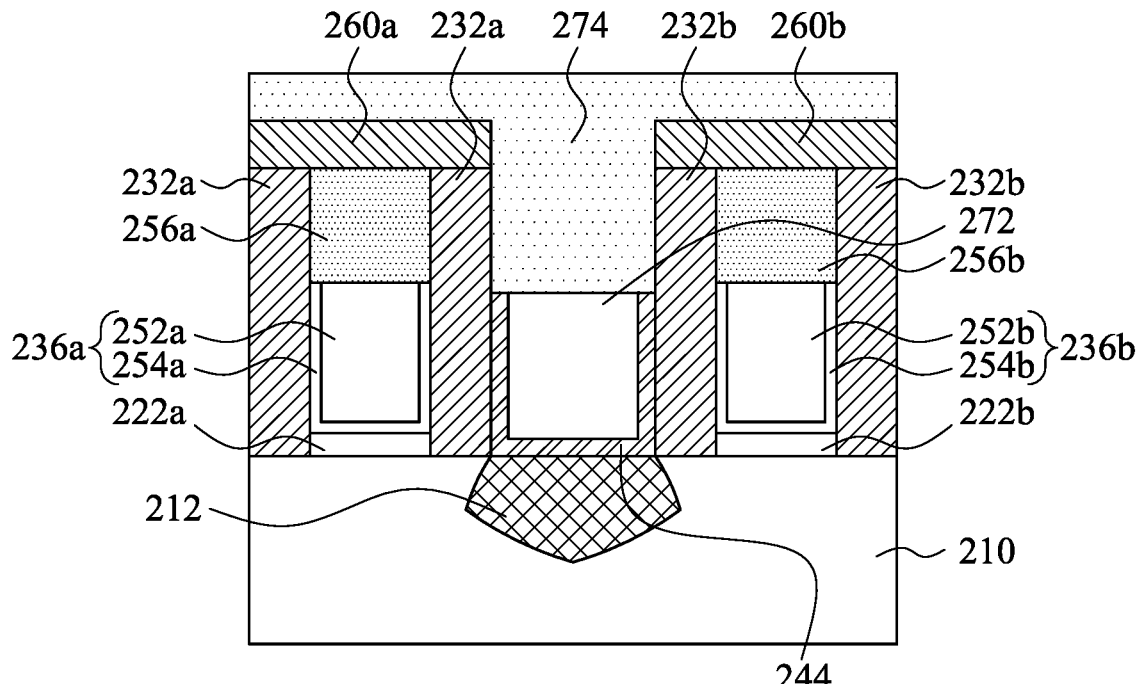

Reference is made to FIG. 18. A second hard mask 274 fills in the opening 273 overlying the bottom conductive feature 272 and the first barrier layer 244. A material of the second hard mask 274 includes, for example, SiO, SiN, SiOC, and SiOCN. The second hard mask 274 serves to protect the underlying components like bottom conductive feature 272 and the active devices during subsequent via formation process. The material of the first hard masks 256a and 256b and the second hard mask 274 may be the same. For example, when the first hard masks 256a and 256b contain a material of SiN, the second hard mask 274 may be made of SiN as well. In some embodiments, the first hard masks 256a and 256b is made of SiOCN, and the second hard mask 274 is made of SiN. An etching selectivity between the helmet layers 260a and 260b and the second hard mask 274 is greater than approximately 10. For example, when the helmet layers 260a and 260b are made of AlON, the second hard mask 274 may be made of SiO.

Figure 19:
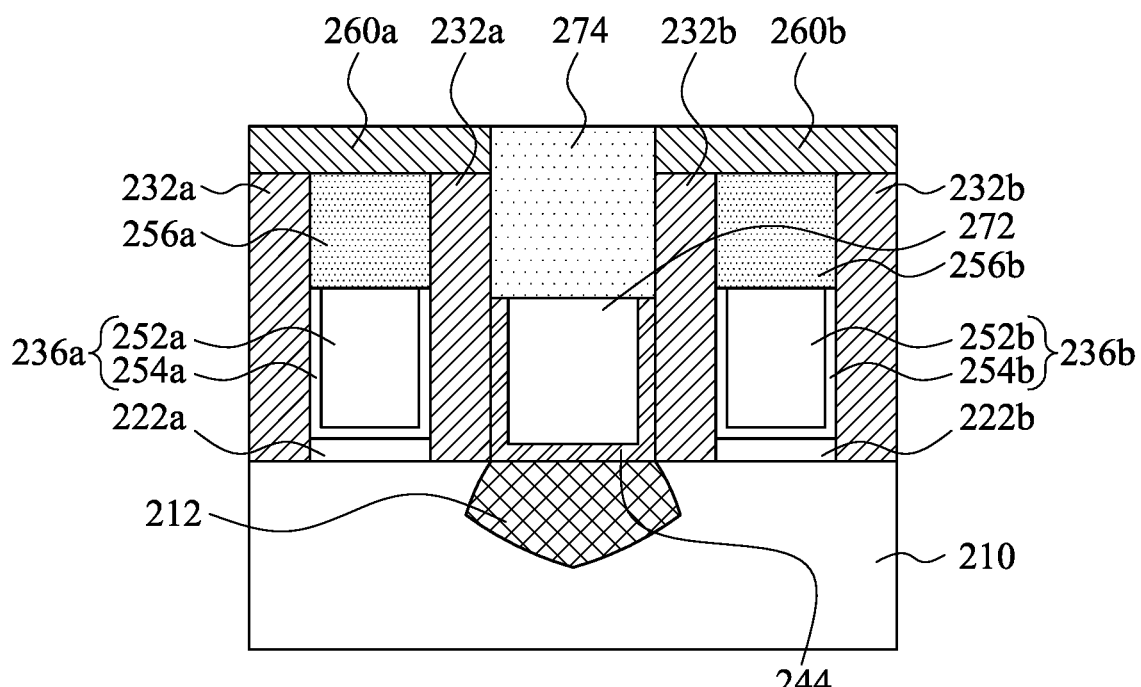

Reference is made to FIG. 19. A polishing process, for example, CMP is performed, and the second hard mask 274 is lowered to level with the top surface of the neighbouring helmet layers 260a and 260b.

Figure 20:
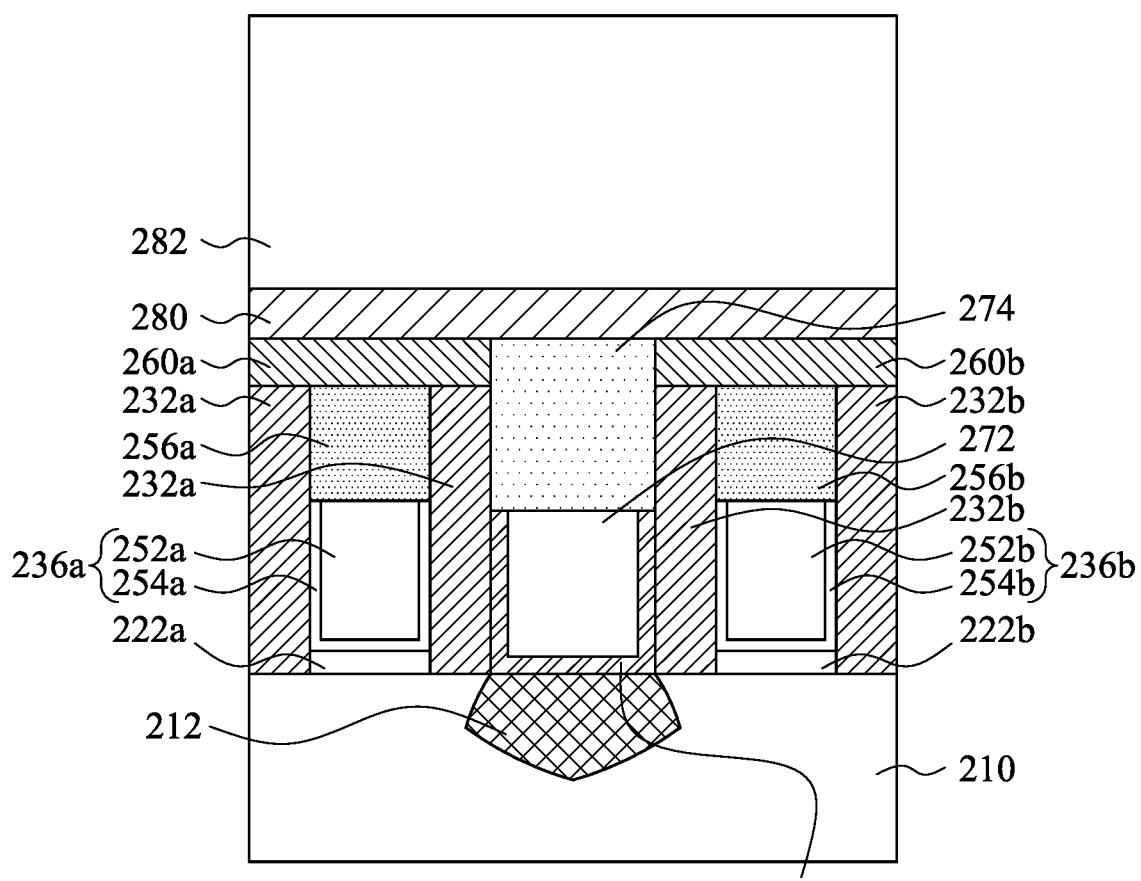

Reference is made to FIG. 20 and operation 150 in FIG. 1. A contact etch stop layer (CESL) 280 and a second ILD layer 282 are formed. The contact etch stop layer 280 (metal contact etch stop layer) is formed by a deposition process such as, for example, CVD, PECVD, chemical solution deposition, or evaporation. The contact etch stop layer 280 includes a material such as, for example, SiO, SiN, SiOC, and SiOCN. The contact etch stop layer 280 blankets the semiconductor substrate, and the helmet layers 260a and 260b and second hard mask 274 are under the coverage of the contact etch stop layer 280. The first and second gate stacks 236a and 236b are under protection of the contact etch stop layer 280 and the helmet layers 260a and 260b. It is understood that the material of the first hard masks 256a and 256b, second hard mask 274, and contact etch stop layer 280 may be the same. For example, when the first hard masks 256a and 256b are made of SiN, the second hard mask 274 and the contact etch stop layer 280 are made of SiN. There is no need to differentiate different materials among the first hard masks 256a and 256b, second hard mask 274 and contact etch stop layer 280 because of the helmet layers 260a and 260b. An etching selectivity between the helmet layers 260a and 260b and the contact etch stop layer 280 is greater than approximately 10. For example, when the helmet layers 260a and 260b are made of ZrO, the contact etch stop layer 280 may be made of SiOC.

The first hard masks 256a and 256b, second hard mask 274 and contact etch stop layer 280 may include the same material. For example, when the first hard masks 256a and 256b are made of SiO, the second hard mask 274 and contact etch stop layer 280 may be made of SiO. Furthermore, an etching selectivity between the first hard masks 256a and 256b and the helmet layers 260a and 260b is greater than approximately 10. Similarly, this etching selectivity applies to the relationships between the second hard mask 274 and the helmet layers 260a and 260b, and between the contact etch stop layer 280 and the helmet layers 260a and 260b. In some embodiments, the first hard masks 256a and 256b may have different materials from the second hard mask 274. When it comes to the etching selectivity between the hard mask and helmet layer, the relationship should still be satisfied. For example, when the first hard masks 256a and 256b include SiO, and the second hard mask 274 include SiOC, the helmet layers 260a and 260b may include a material of HfO, which shows an etching selectivity greater than approximately 10 in comparison with SiO and SiOC.

Reference is still made to FIG. 20 and operation 160 in FIG. 1. A second ILD layer 282 is deposited on the contact etch stop layer 280. The second ILD layer 282 is applied to the upper exposed surface of the contact etch stop layer 280. The second ILD layer 282 may include the same material as the first ILD layer 240 and is formed by similar method.

Figure 21:
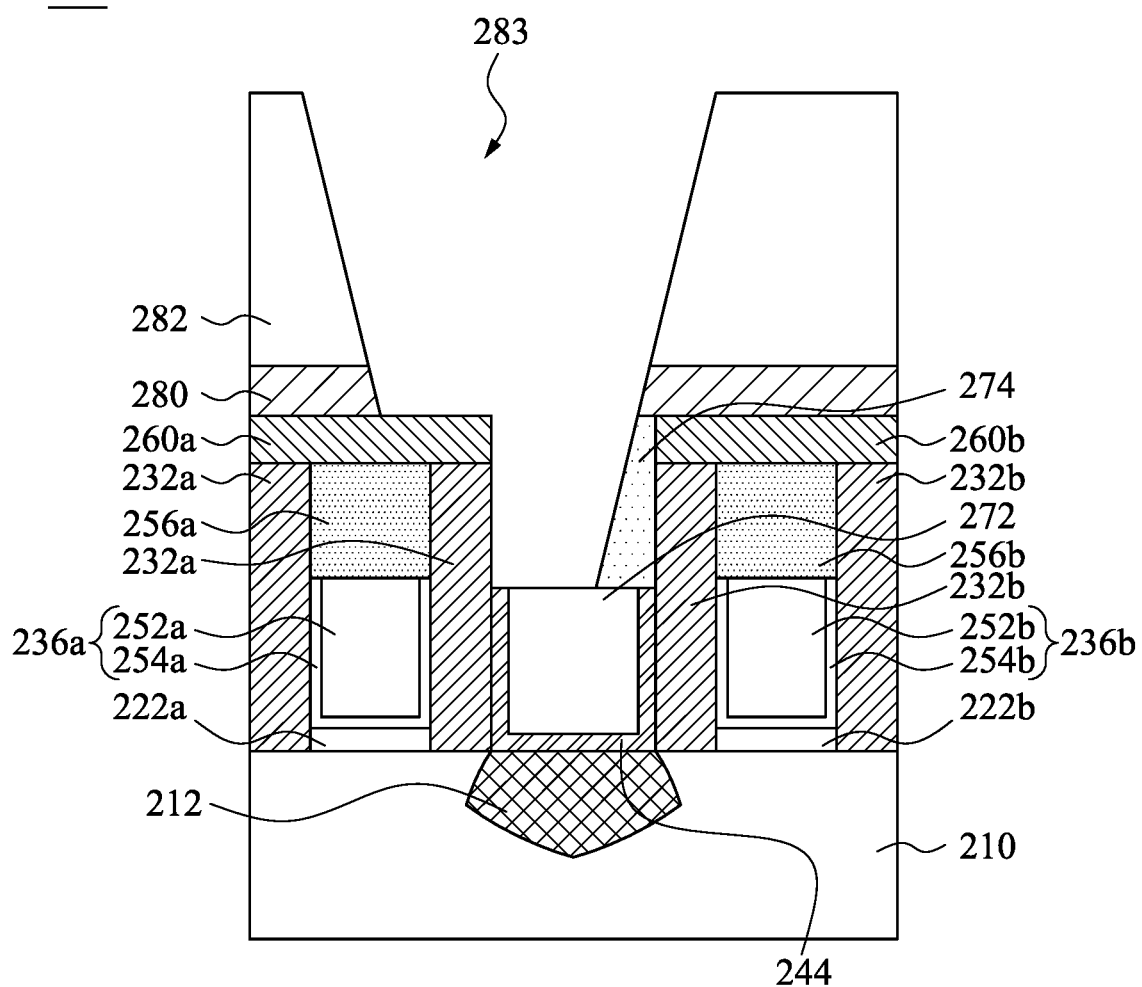

Reference is made to FIG. 21 and operation 170 in FIG. 1. A contact hole 283 may be formed by any suitable process in the second ILD layer 282 and the second hard mask 274. As one example, the formation of the contact hole 283 may include patterning the second ILD layer 282 by a photolithography process, etching the exposed second ILD layer 282 (for example, by using a dry etching, wet etching, and/or plasma etching process) to remove portions of the second ILD layer 282 and the underlying second hard mask 274 over a portion of the bottom conductive feature 272 (source/drain region 212). A portion of the contact hole 283 goes through the second ILD layer 282 and the contact etch stop layer 280 and lands on the helmet layer 260a. The remaining portion of the contact hole 283 goes through the second ILD layer 282, contact etch stop layer 280, and further through a portion of the second hard mask 274, therefore landing on the bottom conductive feature 272.

Because an etching selectivity between the helmet layer 260a and the contact etch stop layer 280 is greater than approximately 10, the contact hole 283 does not go through the helmet layer 260a. If the etching selectivity between the helmet layer 260a and the contact etch stop layer 280 is less than approximately 10, the via etching process may lead to unwanted consumption of the underlying first hard mask 256a and the first spacers 232a. The underlying first hard mask 256a and first spacers 232a are well protected by the helmet layer 260a. The formation of the contact hole 283 does not compromise the integrity of the first hard mask 256a and the first spacers 232a because the helmet layer 260a arrests the etching process so as to protect its underlying components. As a result, a portion of the helmet layer 260a is exposed in the contact hole 283 formation. The second hard mask 274 is not under the coverage of the helmet layers 260a and 260b, and therefore when the contact hole 283 is formed, the contact etch stop layer 280 does not arrest the etching process but allows it to carry on to the second hard mask 274 until the bottom conductive feature 272 is exposed.

Reference is still made to FIG. 21 and operation 170 of FIG. 1. The contact hole is slightly offset from the bottom conductive feature 272. Over the first gate stack 236a, a portion of the contact etch stop layer 280 is removed and revealing the underlying helmet layer 260a. As shown in FIG. 21, the contact hole 283 is slightly offset from the second gate stack 236b. The helmet layer 260b is therefore not exposed, and a portion of the contact etch stop layer 280 overhangs over the second hard mask 274. A portion of the second hard mask 274 remains on the bottom conductive feature 272 as shown in FIG. 21. Due to the high etching selectivity between the contact etch stop layer 280 and the helmet layer 260a, first spacer 232a of the first gate stack 236a is partially exposed but well protected. The first hard mask 256a and the first spacers 232a are less prone to damage (consumption) during contact hole 283 formation. A larger process window for the contact hole 283 can be achieved because the helmet layers 260a and 260b can hold the etching process from proceeding further and retain the integrity of their underlying components. The positioning of the contact hole 283 is therefore having greater freedom.

In addition, the thickness of the first hard masks 256a and 256b can be thinner. More specifically, due to the etching selectivity the helmet layers 260a and 260b are sufficient to protect the gate stacks, such that the buffering function of the first hard masks 256a and 256b during etching is less sought after. Thinner first hard masks 256a and 256b imply a shorter gate height in general. The device dimension can be more compact.

Figure 22:
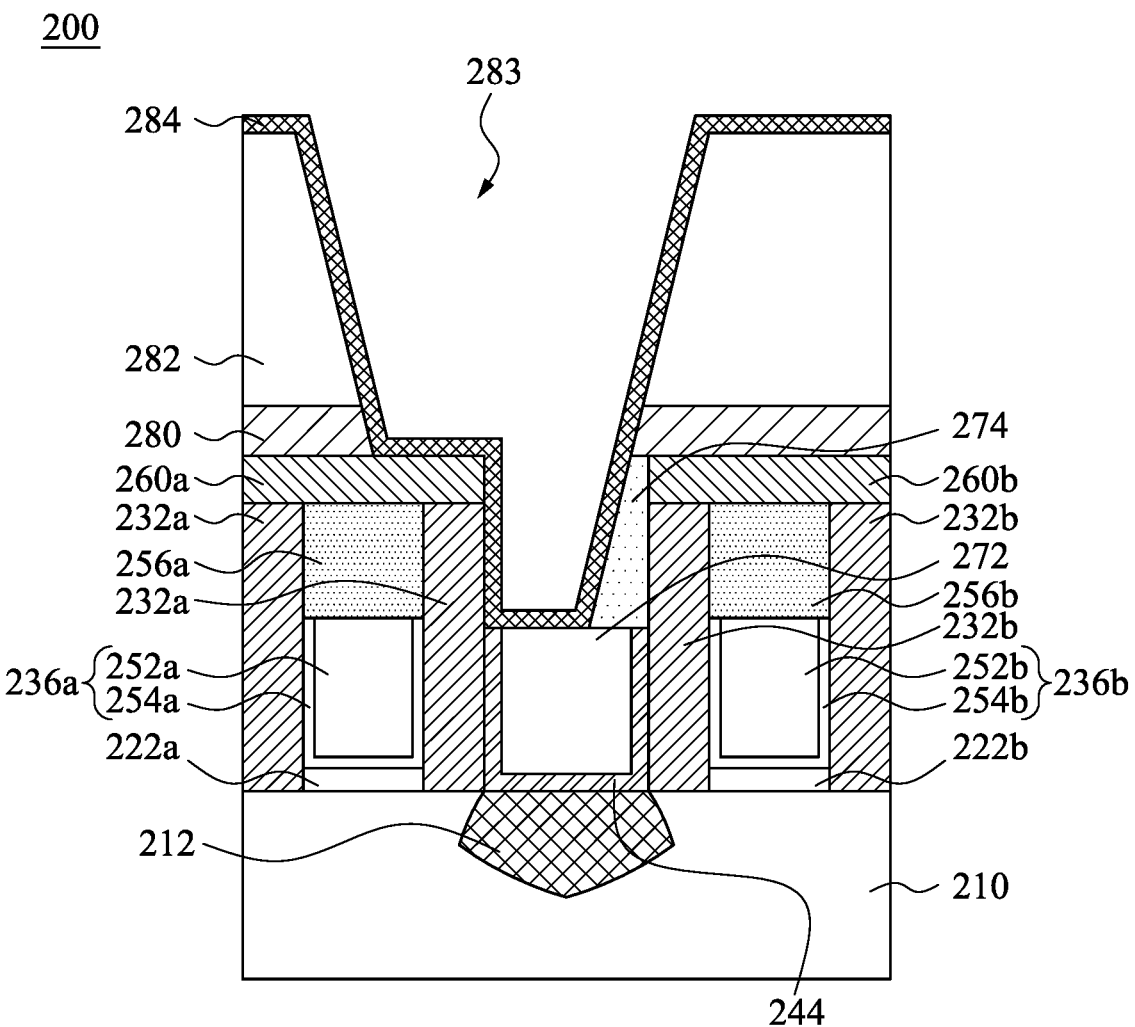

Reference is made to FIG. 22 and operation 170 in FIG. 1. A second barrier layer 284 is deposited on the FinFET device 200. The second barrier layer 284 lines the exposed top surface of the helmet layer 260a, the sidewalk of the second ILD layer 282, first spacer 232a, top surface of the bottom conductive feature 272 (first barrier layer 244), and the second hard mask 274. In some embodiment, the second barrier layer 284 has a thickness of about 10 angstroms to about 300 angstroms. In some embodiments, the second barrier layer 284 is a metal or metal alloy layer. The second barrier layer 284 may include Co, Ag, Al, Zn, Ca, Au, Mg, W, Mo, Ni, Cr, or the like, which may be deposited by using e.g., PVD, CVD, PECVD, LPCVD, or the like.

Figure 23:
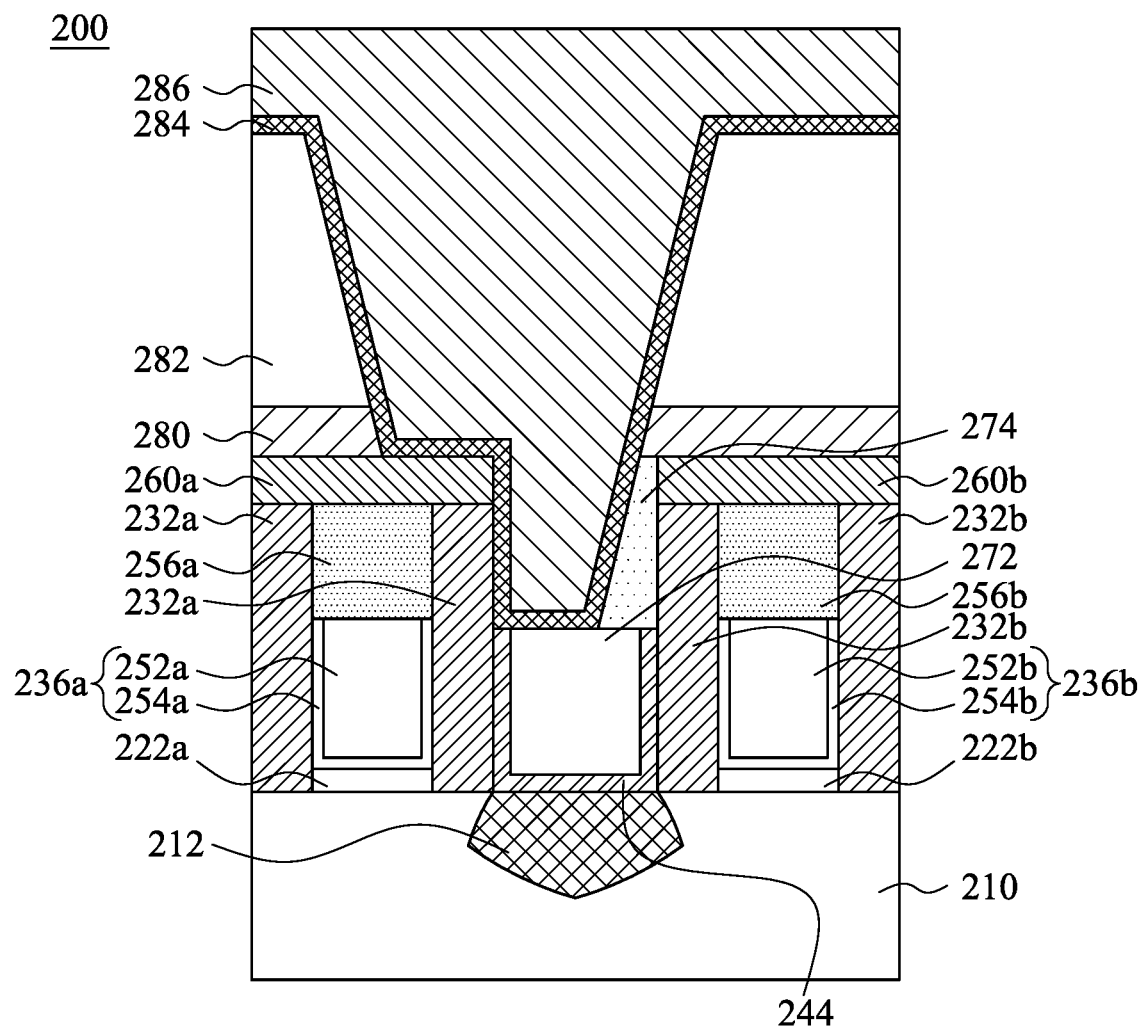

Reference is made to FIG. 23 and operation 180 in FIG. 1. A conductive material layer 286 fills in the contact hole 283. In some embodiments, the conductive material layer 286 includes TiN, TaN, Ta, Ti, Hf, Zr, Ni, W, Co, Cu, or Al. In some embodiments, the conductive material layer 286 may be formed by CVD, PVD, plating, ALD, or other suitable technique. The conductive material layer 286 is wrapped around by the second barrier layer 284. In some embodiment, the conductive material layer 286 may further include a laminate. The laminate may be a linear metal layer or a wetting metal layer. The conductive material layer 286 is deposited until the contact hole 283 is substantially filled or over-filled as shown in FIG. 23.

Figure 24:
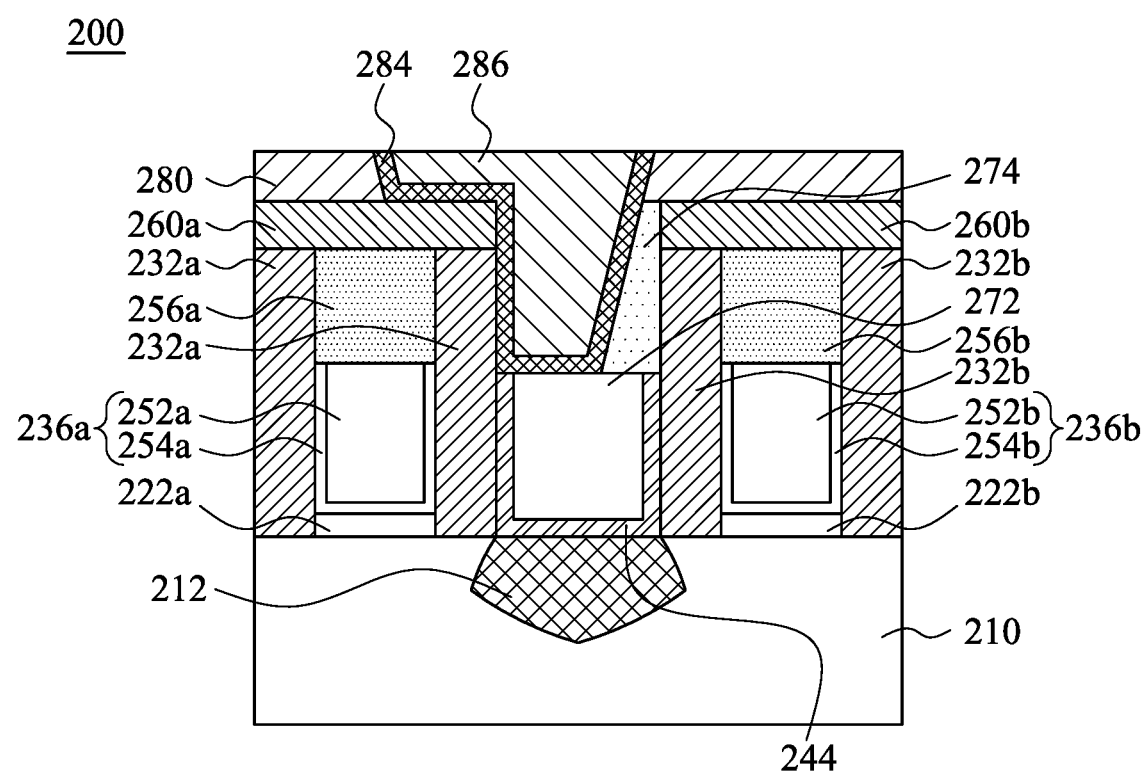

Reference is made to FIG. 24. Then, another CMP is performed to planarize the conductive material layer 286 and second barrier layer 284 after filling the contact hole 283. The CMP removes a portion of the conductive material layer 286 and a portion of the second barrier layer 284 and the entire second ILD layer 282, the CMP process may stop when reaching the top surface of the contact etch stop layer 280, and thus providing a substantially planar surface. After planarization, the contact plug 286 is formed. The contact plug 286 extends through the contact etch stop layer 280 and second hard mask 274 to provide electrical contact to the bottom conductive feature 272 over the source/drain region 212.

The contact plug 286 is in a shape of L and lined by the second barrier layer 284. One leg of the contact plug 286 rests on the helmet layer 260a over the first gate stack 236a, and the other leg of the contact plug 286 stands on the bottom conductive feature 272. The corner of the shape L clutches to the helmet layer 260a and the first spacer 232a. A portion of the second hard mask 274 remains between the contact plug 286 and the second gate stack 236b on the bottom conductive feature 272. The contact plug 286 is therefore spaced apart from the second spacer 232b by the second hard mask 274, and one side of the contact plug 286 lies on the slanting second hard mask 274.

In some embodiments, a third ILD layer is deposited on the upper exposed surface of the contact etch stop layer 280. Next, at least one opening is formed in the third ILD layer utilizing lithography to expose the underlying contact plug 286. The etching may include a dry etching process or a wet chemical etching or a combination thereof. Subsequently, a conductive material fills in the opening, and a via is formed. The via makes electrical contact with the underlying contact plug 286.

The insertion of the helmet layer between the contact etch stop layer and the gate stack (hard mask) ensures a larger processing window in the contact plug formation due to the large etching selectivity between the contact etch stop layer and the helmet layer. The hard mask over the gate stack, bottom conductive feature and contact etch stop layer may use the same material because the helmet layer provides sufficient differentiation, or more precisely, protection, over the gate stack. The overall gate height is reduced because the hard mask over the gate stack can be even thinner when its buffering function during etching is replaced by the helmet layer.

In some embodiments of the present disclosure, a device includes a substrate, a first metal feature over the substrate, first and second spacers, a first dielectric layer, and a second metal feature. The first and second spacers are on opposite sidewalls of the conductive feature, respectively. The first dielectric layer is in contact with the first spacer, in which a top surface of the protection layer is higher than a top surface of the first spacer. The second metal feature is electrically connected to the first metal structure and in contact with a top surface and a sidewall of the protection layer.

In some embodiments of the present disclosure, a device includes a substrate, a first interconnect structure over the substrate, first and second liners, a second interconnect structure, a second interconnect structure, and a dielectric structure. The first and second liners line the opposite sidewalls of the first interconnect structure, respectively. The second interconnect structure is over the first interconnect structure and in contact with the first liner. The dielectric structure is in contact with a top surface of the first interconnect structure and a sidewall of the second interconnect structure, in which a top surface of the dielectric structure is higher than a top surface of the first liner.

In some embodiments of the present disclosure, a device includes a substrate, a first conductive feature over the substrate, first and second spacers, a second conductive feature, a protection layer, and a hard mask. The first and second spacers are on opposite sidewalls of the first conductive feature, respectively. The second conductive feature is interfaced with a first partial region of the first conductive structure and the first spacer. The protection layer is interfaced with the first spacer and the second conductive feature. The hard mask is interfaced with a second partial region of the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   a source/drain region over the substrate;
   a metal gate structure over the substrate and adjacent the source/drain region;
   a first metal feature over the substrate and electrically connected to the source/drain region;
   first and second spacers on opposite sidewalls of the first metal feature, respectively;
   a dielectric hard mask over the first metal feature and in contact with the second spacer, wherein the dielectric hard mask forms an interface with the first metal feature at a position higher than a bottom surface of the second spacer;
   a first dielectric layer in contact with the first spacer, wherein a top surface of the first dielectric layer is higher than a top surface of the first spacer; and
   a second metal feature electrically connected to the first metal feature and in contact with a top surface and a sidewall of the first dielectric layer and the dielectric hard mask.

2. The device of claim 1, wherein a top surface of the dielectric hard mask is higher than a top surface of the first spacer.

3. The device of claim 1, further comprising a contact etch stop layer laterally surrounding the second metal feature and in contact with a top surface of the dielectric hard mask.

4. The device of claim 3, wherein the contact etch stop layer is in contact with the top surface of the first dielectric layer.

5. The device of claim 3, wherein a bottom surface of the contact etch stop is higher than a top surface of the first spacer.

6. The device of claim 1, wherein a lateral interface between the second metal feature and the top surface of the first dielectric layer is higher than the top surface of the first spacer.

7. The device of claim 1, wherein the second metal feature is in contact with the first spacer.

8. The device of claim 1, wherein the second metal feature is separated from the second spacer.

9. The device of claim I, wherein the second metal feature overlaps the first spacer.

10. A device, comprising:
a substrate;
a first interconnect structure over the substrate;
first and second liners lining opposite sidewalk of the first interconnect structure, respectively;
a second interconnect structure in contact with the first interconnect structure and the first liner; and
a dielectric structure made of a continuous material and in contact with a top surface of the first interconnect structure and a sidewall of the second interconnect structure, and forming an interface with the second liner, wherein a top surface of the dielectric structure is higher than a top surface of the first liner.

11. The device of claim 10, further comprising a dielectric layer in contact with the first liner and the second interconnect structure.

12. The device of claim 11, wherein the second interconnect structure includes a protruding portion laterally between the dielectric layer and the dielectric structure.

13. The device of claim 11, wherein the second interconnect structure wraps a corner of the dielectric layer.

14. The device of claim 11, wherein the second interconnect structure is laterally separated from the second liner by the dielectric structure.

15. The device of claim 11, wherein the dielectric layer does not overlap the first interconnect structure and the dielectric structure.

16. A device, comprising:
a substrate;
a source/drain region over the substrate;
a metal gate structure over the substrate and adjacent the source/drain region;
a first conductive feature over the substrate and electrically connected to the source/drain region;
first and second spacers on opposite sidewalls of the first conductive feature, respectively;
a second conductive feature interfaced with a first partial region of the first conductive feature and the first spacer;
a first dielectric protection layer interfaced with the first spacer and the second conductive feature, wherein the first dielectric protection layer forms a horizontal interface with a top surface of the first spacer:
a second dielectric protection layer in contact with the second spacer, wherein the first dielectric protection layer and the second dielectric protection layer are spaced apart from each other in a cross-sectional view; and
a dielectric hard mask interfaced with a second partial region of the first conductive feature.

17. The device of claim 16, wherein the second conductive feature includes a wide portion and a narrow portion extending downwards from the wide portion to the first conductive feature, and the narrow portion has opposite sides respectively in contact with the first dielectric protection layer and the dielectric hard mask.

18. The device of claim 16, further comprising a barrier layer laterally between the first conductive feature and the first spacer, wherein a sidewall of the first spacer and a sidewall of the barrier layer are coplanar and in direct contact, and wherein the sidewall of the first spacer and the sidewall of the first dielectric protection layer are coplanar and in direct contact.

19. The device of claim 16, wherein the first dielectric protection layer does not overlap the first conductive feature and the dielectric hard mask.

20. The device of claim 1, further comprises a second dielectric layer in contact with a top surface of the second spacer, wherein an interface between the first metal feature and the second spacer is vertically aligned with an interface between the dielectric hard mask and the second spacer, and the interface between the dielectric hard mask and the second spacer is vertically aligned with an interface between the dielectric hard mask and the second dielectric layer.

* * * * *